(12) United States Patent
Saeedi Vahdat et al.

(10) Patent No.: US 12,096,622 B2
(45) Date of Patent: Sep. 17, 2024

(54) DIRECTIONAL ETCH FOR IMPROVED DUAL DECK THREE-DIMENSIONAL NAND ARCHITECTURE MARGIN

(71) Applicant: Applied Materials, Inc., Santa Clara, CA (US)

(72) Inventors: Armin Saeedi Vahdat, Burlington, MA (US); John Hautala, Beverly, MA (US); Johannes M. van Meer, Middleton, MA (US)

(73) Assignee: Applied Materials, Inc., Santa Clara, CA (US)

( * ) Notice: Subject to any disclaimer, the term of this patent is extended or adjusted under 35 U.S.C. 154(b) by 427 days.

(21) Appl. No.: 17/502,140

(22) Filed: Oct. 15, 2021

(65) Prior Publication Data

US 2023/0119618 A1 Apr. 20, 2023

(51) Int. Cl.
| | |
|---|---|
| H10B 41/20 | (2023.01) |
| B82Y 10/00 | (2011.01) |
| B82Y 40/00 | (2011.01) |
| H10B 41/23 | (2023.01) |
| H10B 41/27 | (2023.01) |
| H10B 41/41 | (2023.01) |
| H10B 43/20 | (2023.01) |
| H10B 43/23 | (2023.01) |
| H10B 43/27 | (2023.01) |
| H10B 43/40 | (2023.01) |

(52) U.S. Cl.
CPC .............. *H10B 41/20* (2023.02); *H10B 41/41* (2023.02); *H10B 43/20* (2023.02); *H10B 43/40* (2023.02); *B82Y 10/00* (2013.01); *B82Y 40/00* (2013.01)

(58) Field of Classification Search
CPC ........ H10B 41/20; H10B 41/41; H10B 43/20; H10B 43/40; H10B 41/27; H10B 43/23; H10B 43/27; H10B 41/23; B82Y 10/00; B82Y 40/00
See application file for complete search history.

(56) References Cited

U.S. PATENT DOCUMENTS

| | | | |
|---|---|---|---|
| 9,570,463 B1* | 2/2017 | Zhang | H01L 29/66666 |
| 2020/0027835 A1* | 1/2020 | Hsu | H10B 43/10 |
| 2020/0411543 A1* | 12/2020 | Wang | H01L 21/02636 |

* cited by examiner

*Primary Examiner* — Herve-Louis Y Assouman
(74) *Attorney, Agent, or Firm* — KDW Firm PLLC

(57) ABSTRACT

A semiconductor manufacturing process and semiconductor device having an airgap to isolate bottom implant portions of a substrate from upper source and drain device structure to reduce bottom current leakage and parasitic capacitance with an improved scalability on n-to-p spacing scaling. The disclosed device can be implanted to fabricate nanosheet FET and other such semiconductor device. The airgap is formed by etching into the substrate, below a trench in a vertical and horizontal direction. The trench is then filled with dielectric and upper device structure formed on either side of the dielectric filler trench.

10 Claims, 12 Drawing Sheets

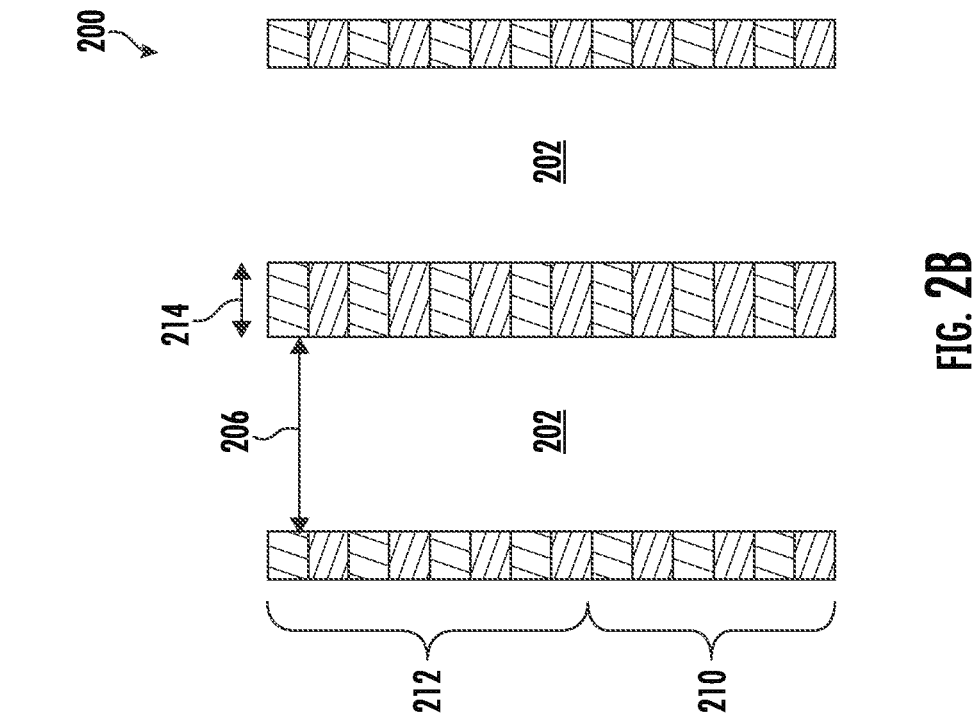
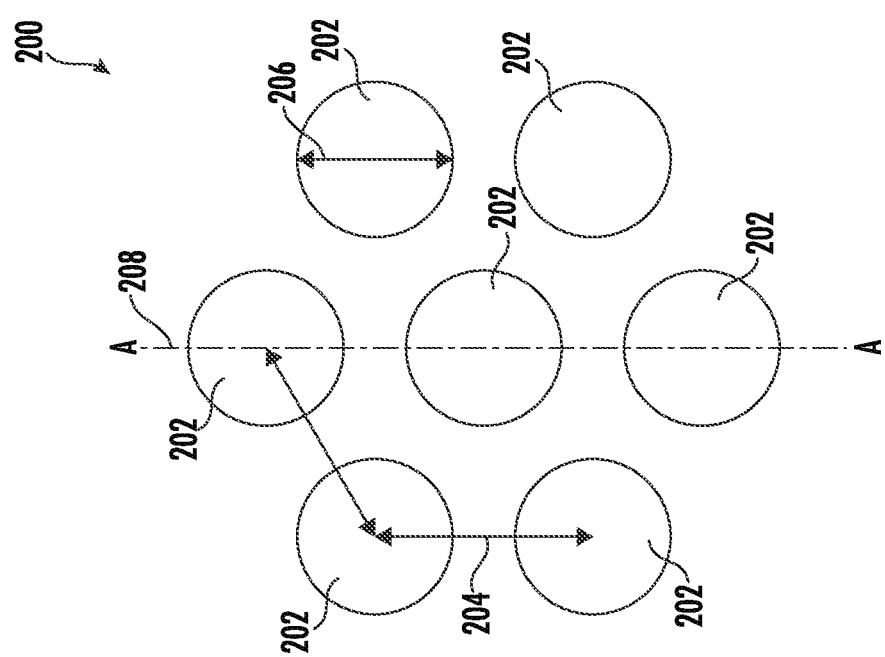
FIG. 2B
FIG. 2A

DIRECTIONAL ETCH FOR IMPROVED DUAL DECK THREE-DIMENSIONAL NAND ARCHITECTURE MARGIN

FIELD OF THE DISCLOSURE

The present description, example embodiments, and claims relate to semiconductor devices and particularly to reducing placement errors for dual deck three-dimensional (3D) NAND architectures.

BACKGROUND OF THE DISCLOSURE

FIG. 1 illustrates a 3D NAND device 100. In general, 3D NAND devices (e.g., 3D NAND device 100, or the like) include a stack of memory circuitry layered on top of each other. In particular, the layers of memory circuitry are stacked vertically with the intent to provide a faster memory device with greater capacity and lower power requirements than conventional two-dimensional (2D) NAND circuitry.

As can be appreciated, stacking multiple layers on top of each other increases the manufacturing difficulty. 3D NAND device 100 of FIG. 1 depicts a lower deck 102 with an upper deck 104 stacked on top of the lower deck 102. Each of the "decks" comprise a number of memory holes. For example, lower deck 102 includes lower deck memory holes 106a, 106b, 106c, and 106d while upper deck 104 includes upper deck memory holes 108a, 108b, 108c, and 108d. One challenge in manufacturing 3D NAND devices like 3D NAND device 100 is that the memory holes need to be aligned with each other. For example, upper deck memory holes 108a, 108b, 108c, and 108d need to be aligned with respective lower deck memory holes 106a, 106b, 106c, and 106d. In particular, FIG. 1 depicts lower deck memory hole 106a and upper deck memory hole 108a aligned. However, lower deck memory holes 106b, 106c, 106d are not aligned with respective upper deck memory holes 108b, 108c, and 108d. In particular, lower deck memory hole 106b and upper deck memory hole 108b are misaligned due to a photolithography overlay error; lower deck memory hole 106c and upper deck memory hole 108c are misaligned due to a dry etch tilt error; and lower deck memory hole 106d and upper deck memory hole 108d are misaligned due to a dry etch twist error.

One attempt to overcome the challenges with aligning memory holes in 3D NAND devices is to increase the upper critical dimension of the memory holes. However, this solution has limited applicability and adds other complications to manufacturing such as, bowing of the critical dimension leading to out-of-specification (OOS) memory holes.

Another attempt to overcome the challenges with aligning memory holes in 3D NAND devices is to implement an "inter-deck" manufacturing flow between formation of each layer (e.g., lower deck 102, and upper deck 104, or the like) including, for example, lithography, dry etch, strip, fill, and chemical mechanical planarization (CMP). However, as will be appreciated adding processing steps to the manufacturing process increases cost and time to manufacture the device and further introduces additional opportunities for process errors to form.

Accordingly, there is a need for an improved, low-cost process and/or structure for reducing misalignment between memory holes of layers of a 3D NAND device.

BRIEF SUMMARY

BRIEF DESCRIPTION OF THE SEVERAL VIEWS OF THE DRAWINGS

To easily identify the discussion of any particular element or act, the most significant digit or digits in a reference number refer to the figure number in which that element is first introduced. Furthermore, like numbering represents like elements.

The drawings are merely representations, not intended to portray specific parameters of the disclosure and are not necessarily to scale. The drawings are intended to depict exemplary embodiments of the disclosure, and therefore are not considered as limiting in scope.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

Figure 1:
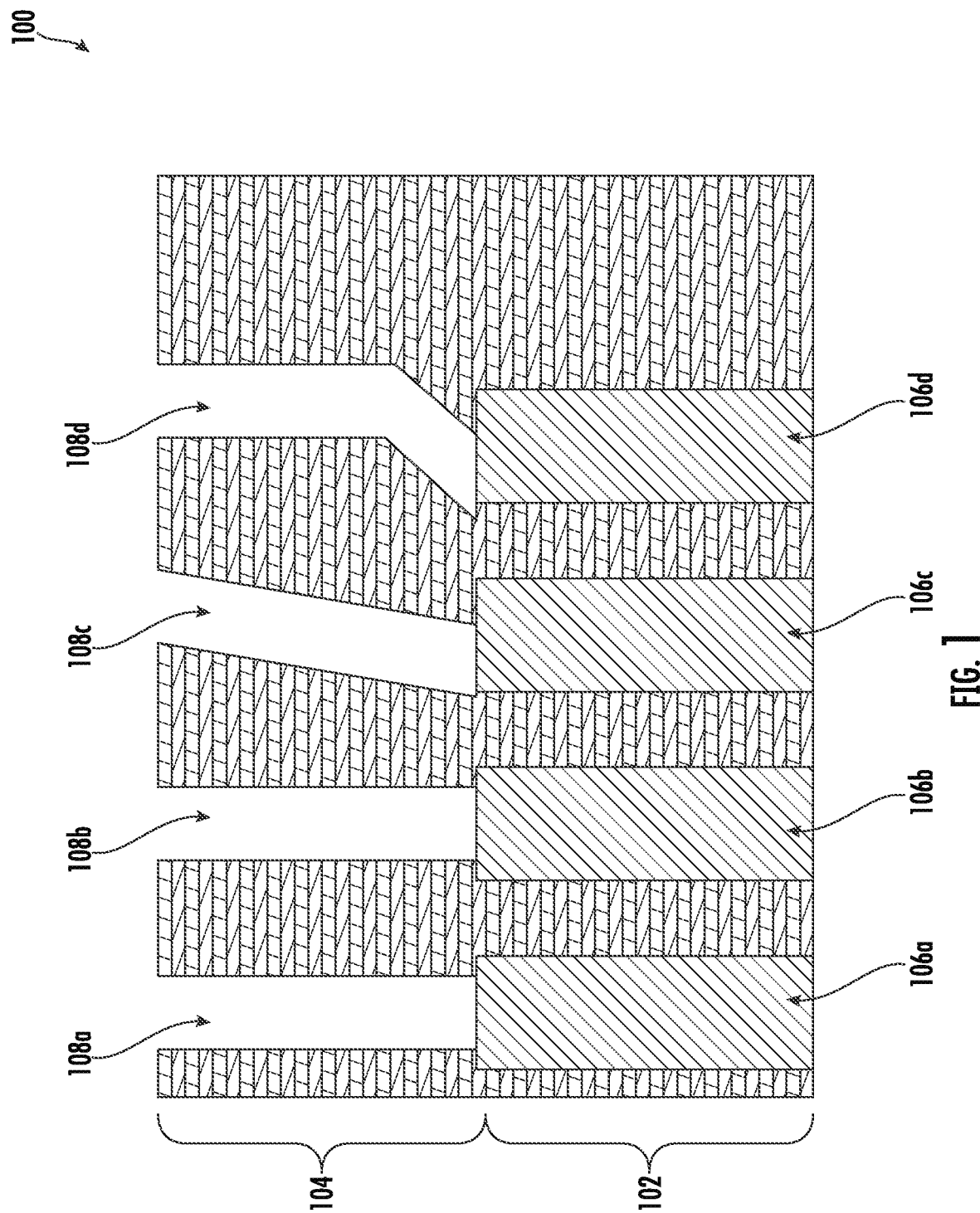

FIG. 1 illustrates a 3D NAND device 100 having some misaligned memory holes.

FIG. 2A illustrates a top view of a lower deck of a 3D NAND device 200.

FIG. 2B illustrates a side cutaway view of the lower deck depicted in FIG. 2A.

Figure 3A:
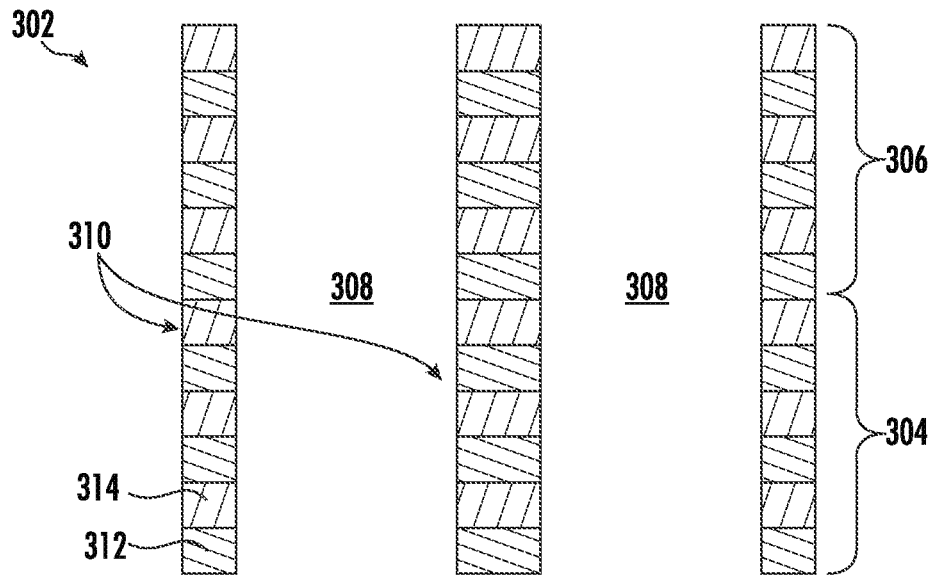

FIG. 3A illustrates a 3D NAND device 300 at a stage of manufacture.

Figure 3B:
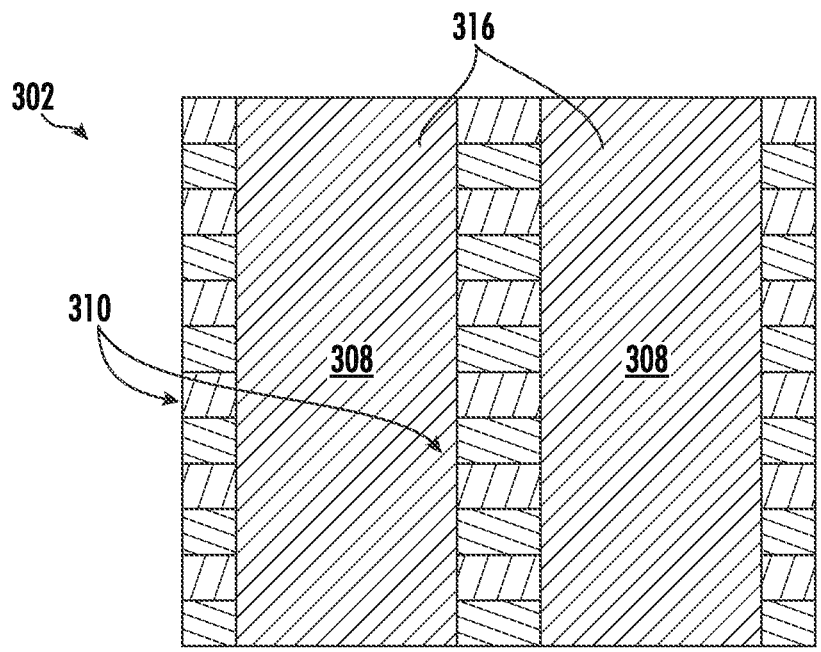

FIG. 3B illustrates the 3D NAND device 300 at a further stage of manufacture.

Figure 3C:
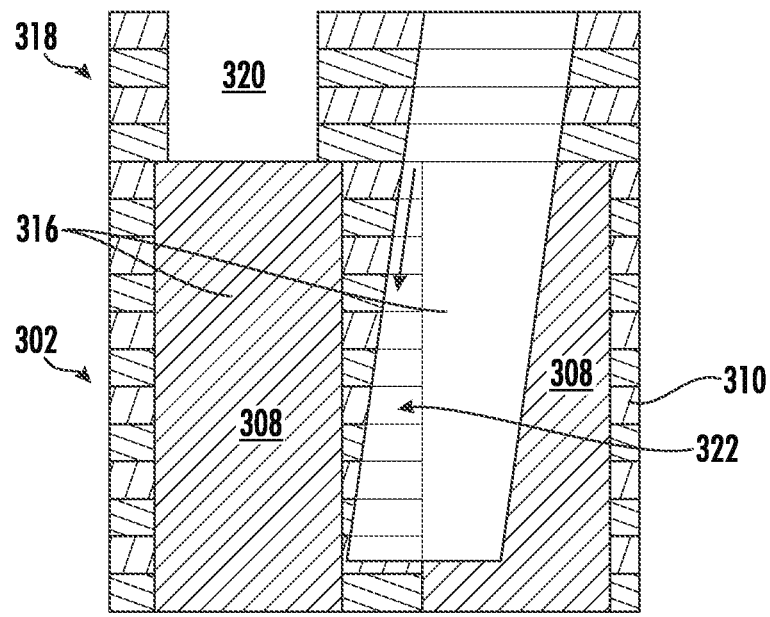

FIG. 3C illustrates the 3D NAND device 300 at a further stage of manufacture.

Figure 3D:
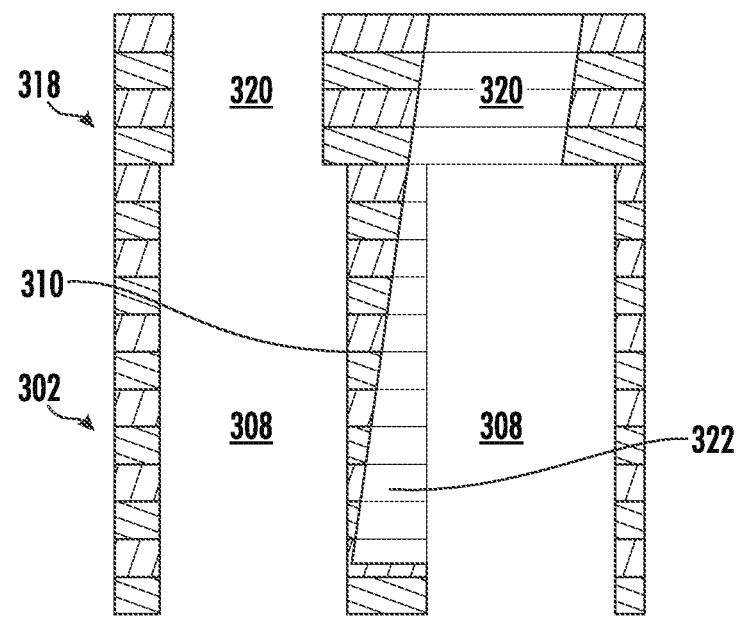

FIG. 3D illustrates the 3D NAND device 300 at a further stage of manufacture.

Figure 3E:
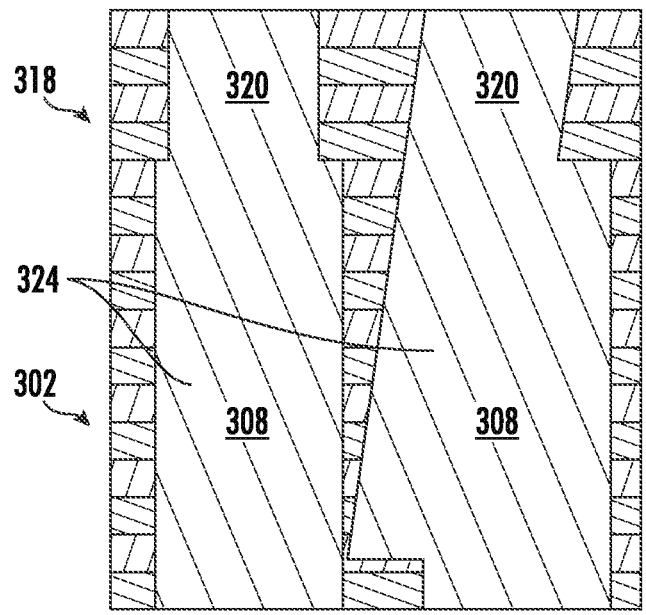

FIG. 3E illustrates the 3D NAND device 300 at a further stage of manufacture.

Figure 3F:
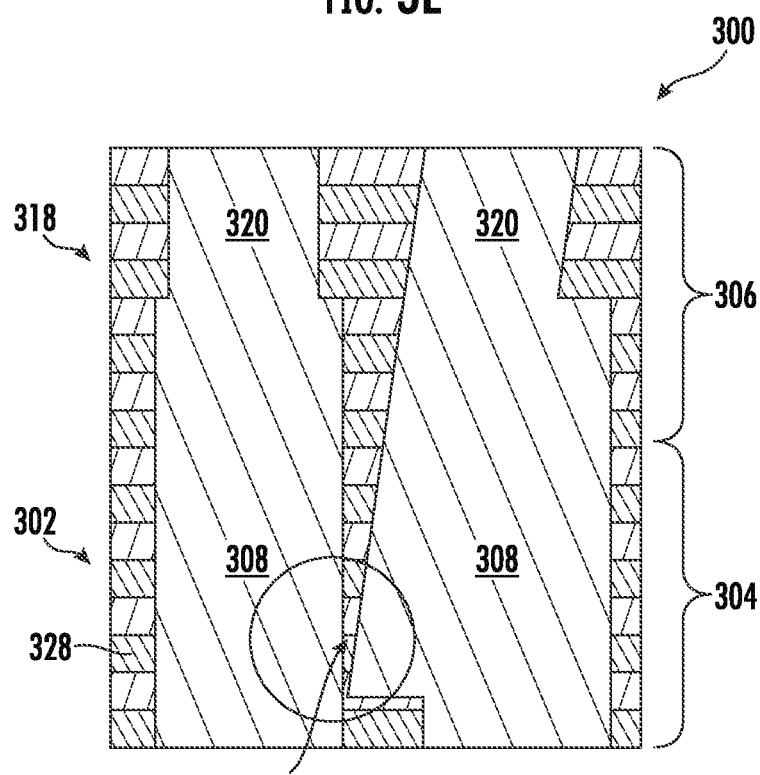

FIG. 3F illustrates the 3D NAND device 300.

Figure 4:
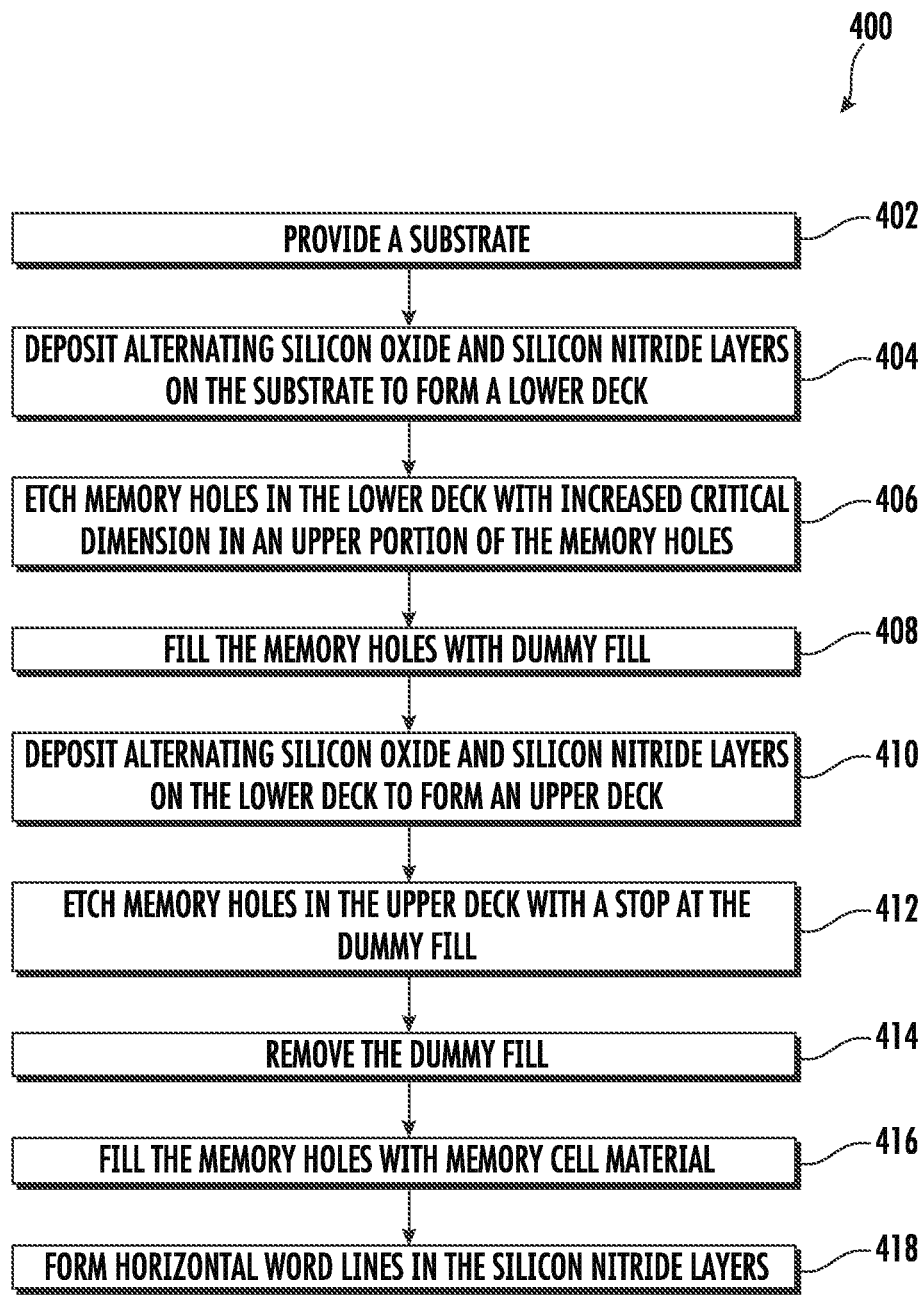

FIG. 4 illustrates a method 400 for manufacturing a 3D NAND device, in accordance with at least one embodiment of the present disclosure.

Figure 5B:
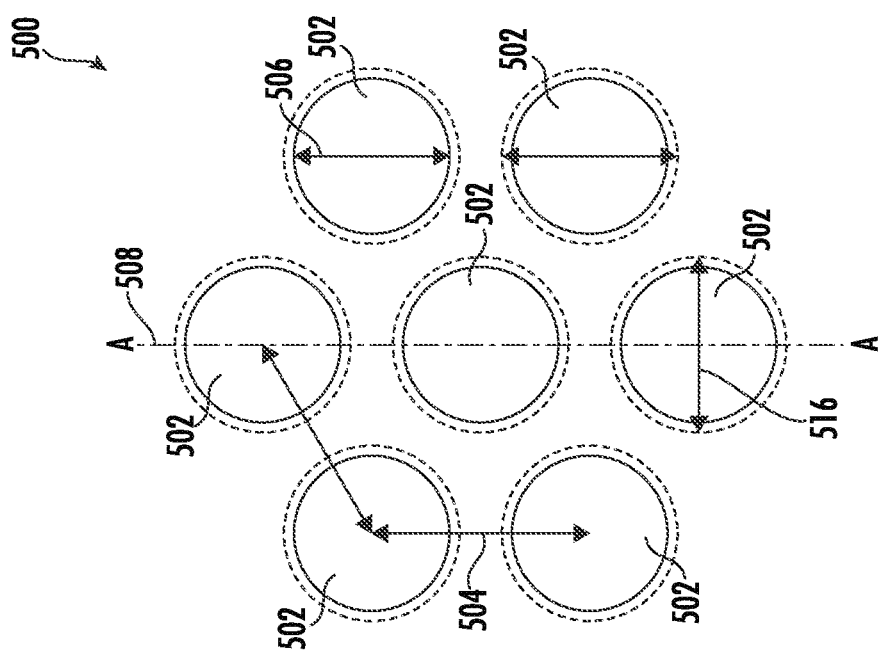
Figure 5A:
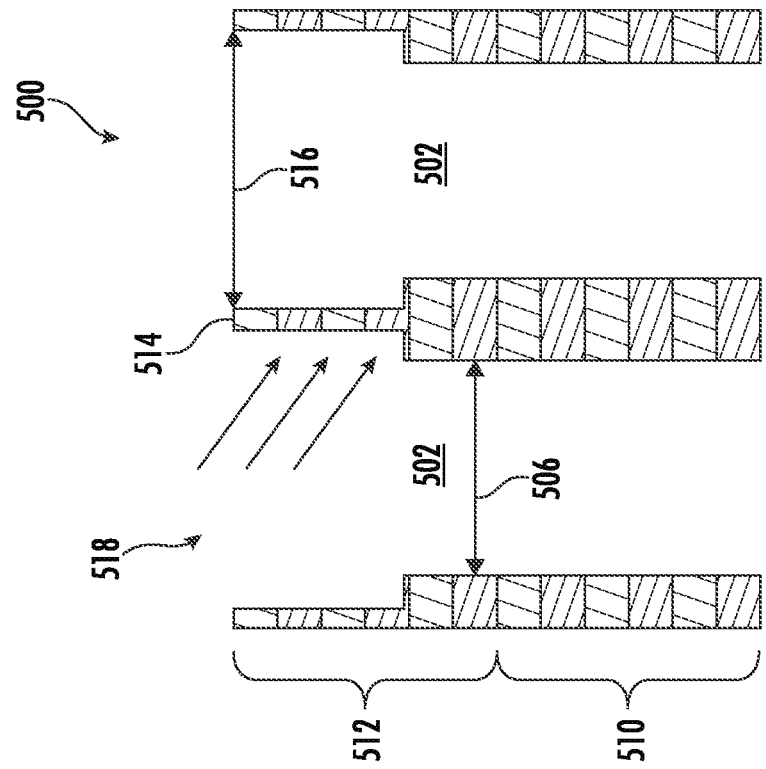

FIG. 5A illustrates a top view of a lower deck 500 of a 3D NAND device having memory holes with a widened CD an upper portion of the memory holes, in accordance with at least one embodiment of the present disclosure.

FIG. 5B illustrates a side cut away view of the lower deck 500 of the 3D NAND device of FIG. 5A, in accordance with at least one embodiment of the present disclosure.

Figure 6A:
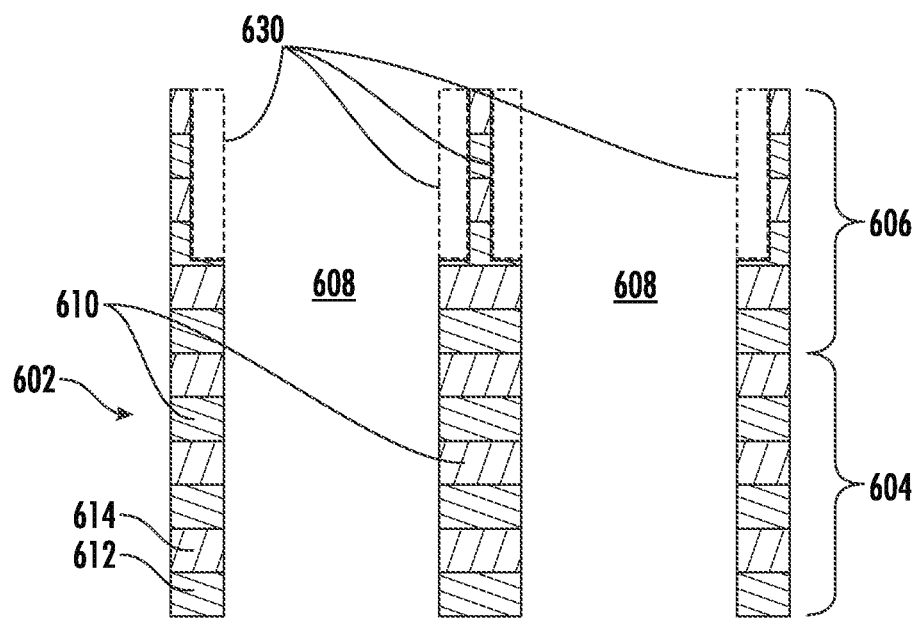

FIG. 6A illustrates a 3D NAND device 600 at a stage of manufacture, in accordance with at least one embodiment of the present disclosure.

Figure 6B:
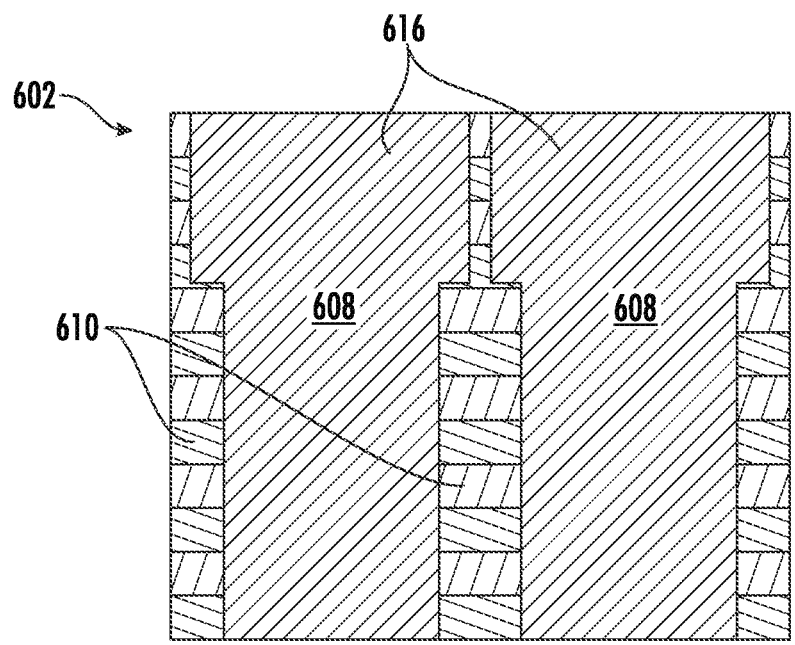

FIG. 6B illustrates the 3D NAND device 600 at a further stage of manufacture, in accordance with at least one embodiment of the present disclosure.

Figure 6C:
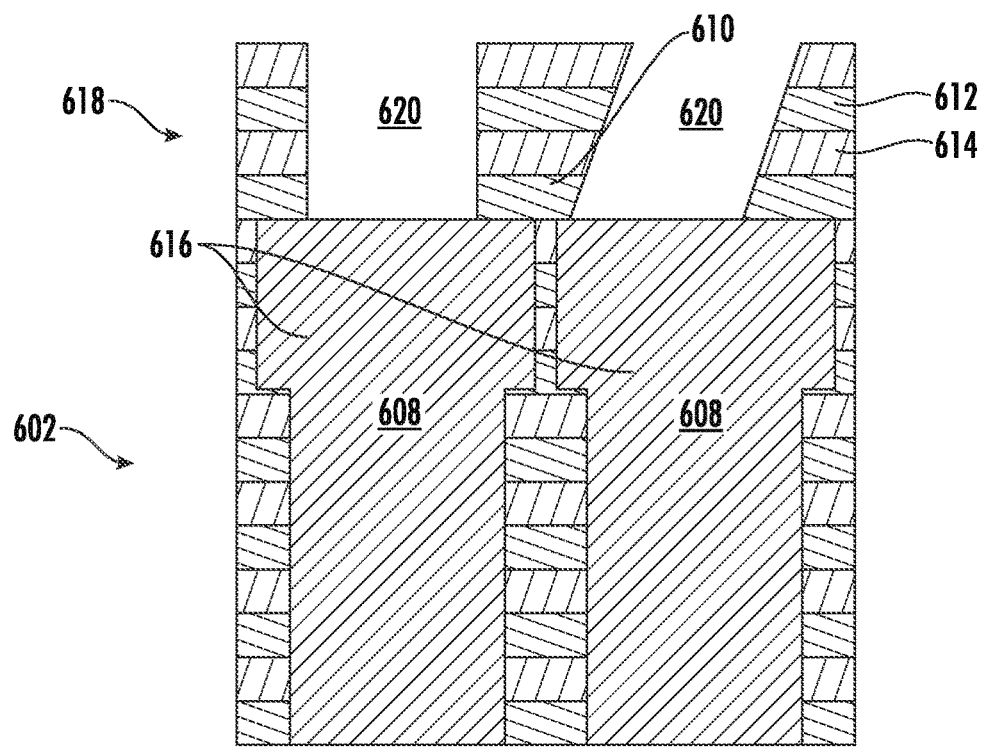

FIG. 6C illustrates the 3D NAND device 600 at a further stage of manufacture, in accordance with at least one embodiment of the present disclosure.

Figure 6D:
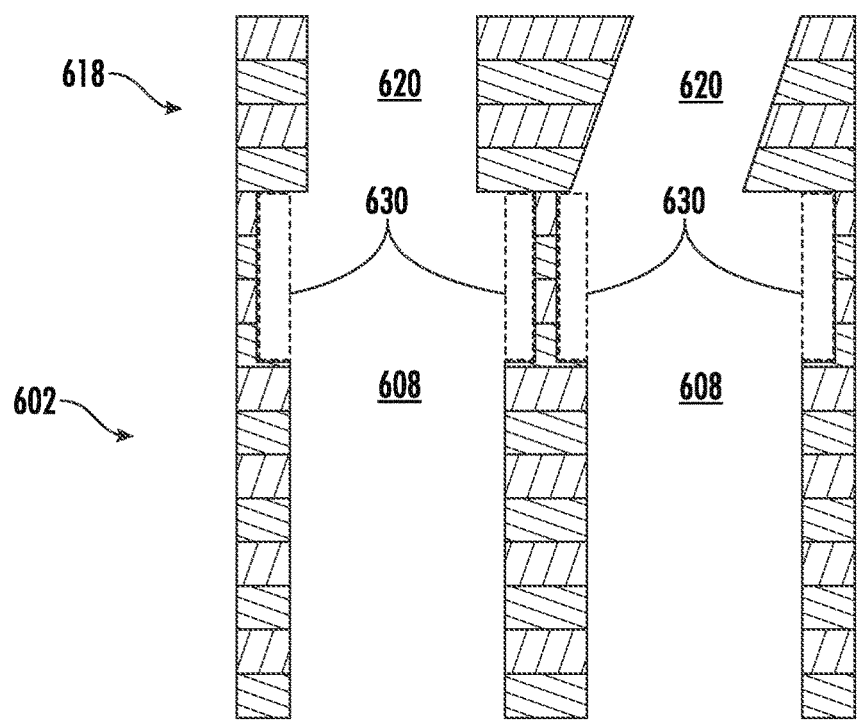

FIG. 6D illustrates the 3D NAND device 600 at a further stage of manufacture, in accordance with at least one embodiment of the present disclosure.

Figure 6E:
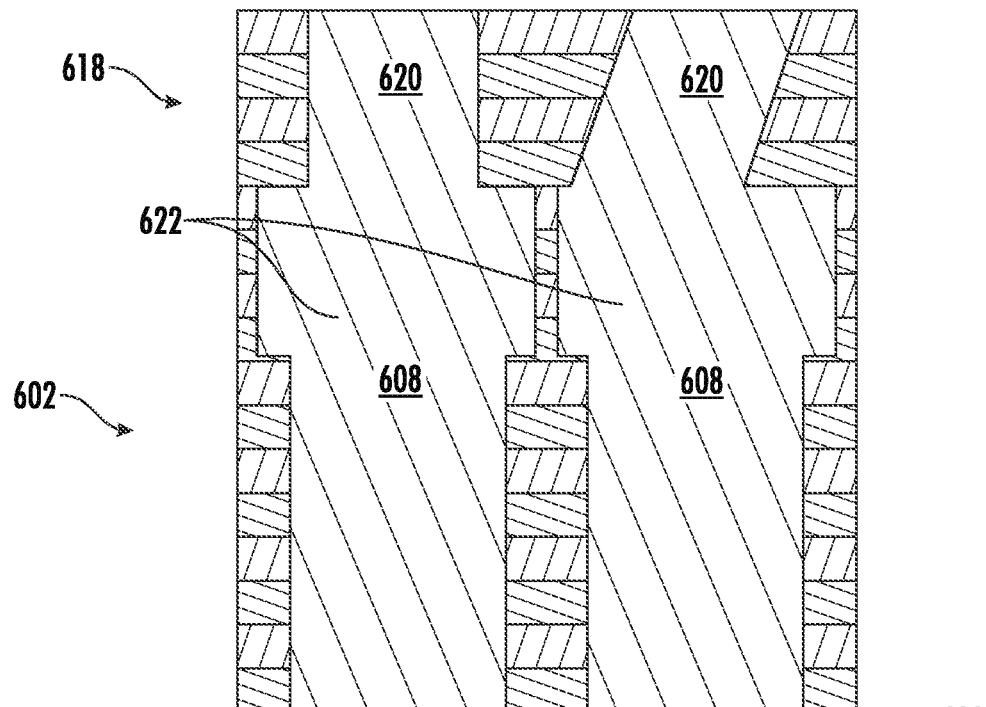

FIG. 6E illustrates the 3D NAND device 600 at a further stage of manufacture, in accordance with at least one embodiment of the present disclosure.

Figure 6F:
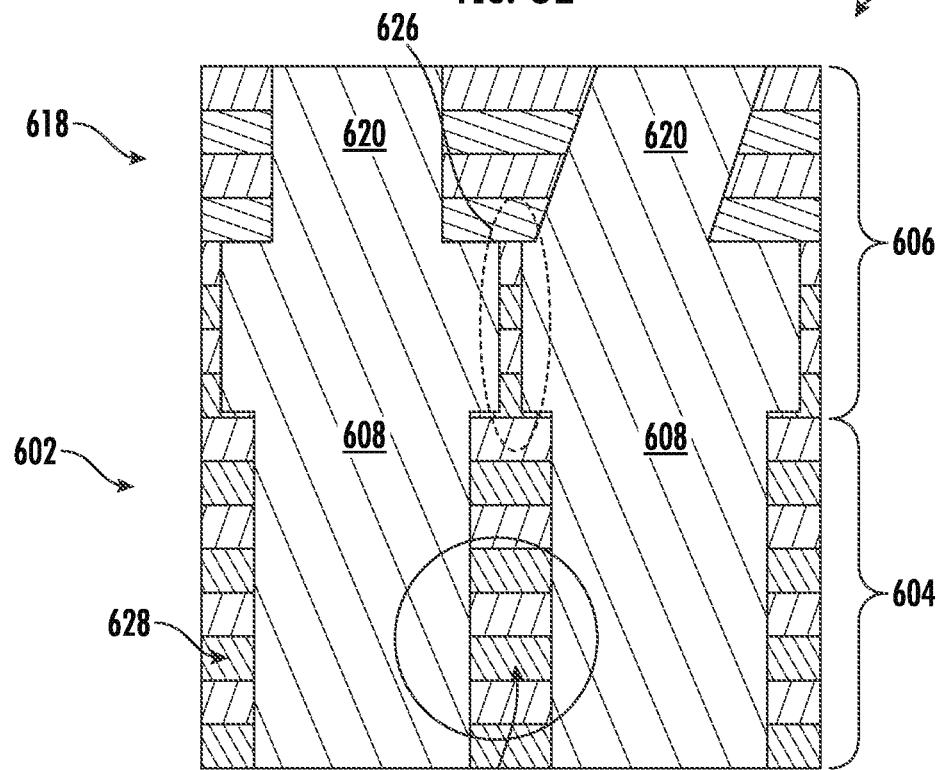

FIG. 6F illustrates the 3D NAND device 600 in accordance with at least one embodiment of the present disclosure.

Figure 7:
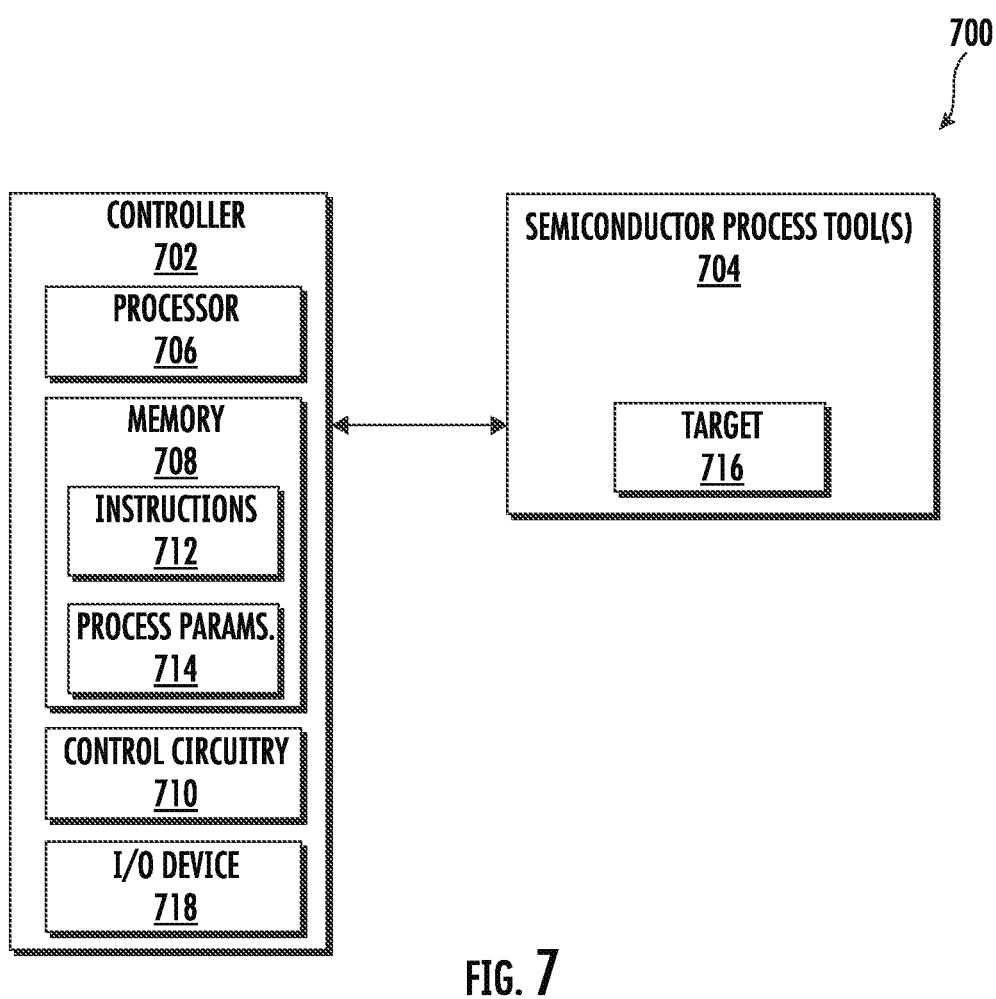

FIG. 7 illustrates a semiconductor manufacturing system 700, in accordance with at least one embodiment of the present disclosure.

Figure 8:
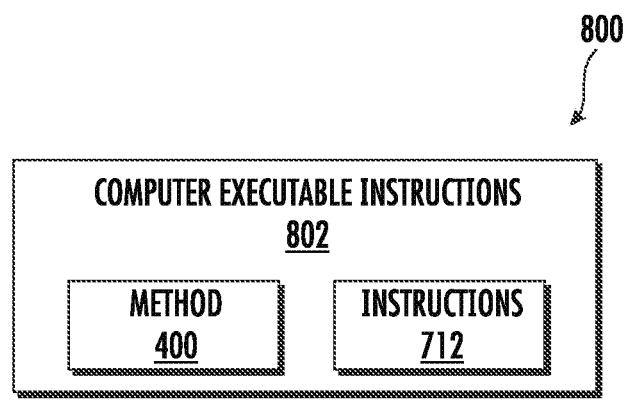

FIG. 8 illustrates a computer-readable storage medium 800 in accordance with at least one embodiment of the present disclosure.

DETAILED DESCRIPTION

Methods, devices, and systems in accordance with the present disclosure will now be described more fully hereinafter with reference to the accompanying drawings, where various embodiments are shown. The methods, devices, and systems may be embodied in many different forms and are not to be construed as being limited to the embodiments set forth herein. Instead, these embodiments are provided so the disclosure will be thorough and complete, and will fully convey the scope of the described methods and devices to those skilled in the art.

As mentioned above, there is a need for an improved process for manufacturing 3D NAND devices to reduce reduces defects and errors due to the tight manufacturing tolerances needed to manufacture 3D NAND devices and particularly to form memory holes stacked on top of each other.

FIG. 2A illustrates a top view of a lower deck of a 3D NAND device 200, showing several memory holes 202 with a center spacing 204 and a critical dimension (CD) 206. In some examples, the center spacing 204 can be of 150 nanometers (nm) while the CD 206 can be 110 nm. FIG. 2B illustrates a side cut-away view of the lower deck of the 3D NAND device 200 along cut line 208. As depicted, the lower deck of the 3D NAND device 200 includes an active layer 210 and a dummy layer 212. Memory holes 202 are also depicted having the critical dimension (CD) 206 and an inter memory hole spacing 214. In this example, the inter memory hole spacing 214 can be 40 nm (e.g., 150 nm center spacing 204 less 110 nm critical dimension (CD) 206). It is noted that the above ranges are given for example only and not to be limiting.

FIG. 3A to FIG. 3F schematically illustrate a forming a multi-layer 3D NAND device 300. The 3D NAND device 300 is depicted in FIG. 3F, however, manufacturing or formation of the 3D NAND device 300 begins with a lower deck 302 as depicted in FIG. 3A. Lower deck 302 can be like the lower deck depicted in FIG. 2A and FIG. 2B. In general, lower deck 302 having active layer 304 and dummy layer 306. Further, lower deck 302 includes lower memory holes 308 formed between sidewalls 310 in the active layer 304 and dummy layer 306. In some embodiments, sidewalls 310 can be formed from alternating layers of silicon (Si) material, for example, via plasma enhanced vapor chemical deposited (PEVCD) process. As a specific example, silicon nitride 312 and silicon oxide 314 can be formed via PEVCD.

FIG. 3B depicts lower memory hole 308 filled with a dummy fill 316, such as aluminum oxide (AiO), or the like. Lower memory holes 308 filled with dummy fill 316 are often processed with a chemical mechanical polishing (CMP) or alternatively referred to as chemical mechanical planarization, which prepares the top surface of the lower deck 302 for formation of an upper deck thereon.

FIG. 3C depicts the processed lower deck 302 with an upper deck 318 formed thereon (e.g., via PEVCD). Upper deck 318 includes an upper memory hole 320 formed thereon via an etch process with an etch stop at the dummy fill 316. However, FIG. 3C depicts common errors in formation of upper memory holes 320 where due to tilt in the etch, portions of sidewalls 310 will be etched away (shown as removed portion 322).

This is depicted in greater detail in FIG. 3D, which shows lower deck 302 and upper deck 318 after removal of dummy fill 316. As depicted in this figure, upper memory holes 320 are formed in upper deck 318 atop lower deck 302 which has lower memory holes 308 disposed below the upper memory holes 320. However, due to the tilt in the etch process depicted in FIG. 3C, removed portion 322 of sidewalls 310 form a significant defect in the overall 3D NAND device. Not only does this contribute to a misalignment between lower memory holes 308 and upper memory holes 320 but areas of the sidewalls 310 between lower memory holes 308 is reduced and can form defects, as depicted in greater detail below.

Once the lower deck 302 and upper deck 318 including lower memory holes 308 and upper memory holes 320 are formed and the dummy fill 316 removed, the lower memory holes 308 and upper memory holes 320 are filled with memory cell fill material 324. This is depicted in FIG. 3E. Filling the lower memory holes 308 and upper memory holes 320 with memory cell fill material 324 may be accompanied by another CMP process.

FIG. 3F depicts the 3D NAND device 300 with word like (WL) metal 328 formed in place of silicon nitride 312. However, as can be seen from FIG. 3F, 3D NAND device 300 includes a potential point of failure 326. Point of failure 326 results from the tilt in the etch process step depicted in FIG. 3C and the portion of the sidewalls 310 that was removed (e.g., removed portion 322). That is, the width of the sidewalls 310 between lower memory holes 308 is reduced to an unacceptably small margin, resulting in reduced yield. The present disclosure provides a unique process flow that can be implemented to mitigate the effects of errors in the manufacturing process of forming 3D NAND devices, like 3D NAND device 300.

FIG. 4 illustrates a method 400 for forming a 3D NAND device, in accordance with embodiment(s) of the present disclosure. Method 400 is described with reference to FIG. 5A and FIG. 5B as well as FIG. 6A to FIG. 6F, which show a 3D NAND device 600, manufactured according to embodiments of the present disclosure. Method 400 can begin on block 402 "provide a substrate" where a semiconductor substrate can be provided. Continuing to block 404 "deposit alternating layers of silicon oxide and silicon nitride on the substrate to form a lower deck" alternating layers of silicon material can be deposited on a substrate (not shown). For example, FIG. 6A shows a lower deck 602 formed from alternating layers of silicon (Si) material, silicon nitride 612 and silicon oxide 614, which can be formed via PEVCD.

Continuing to block 406 "etch memory holes in the lower deck with increased critical dimension in an upper portion of the memory hole" memory holes are etched in the lower deck where an upper portion of the memory hole has an increased critical dimension. For example, lower memory holes 608 can be etched into lower deck 602 forming sidewalls 610. FIG. 5A depicts illustrates a top view of a lower deck 500, showing a number of memory holes memory hole 502 with a center spacing 504 of 150 nanometers (nm) and a critical dimension (CD) 506 of 110 nm and a widened CD 516.

FIG. 5B illustrates a side cut-away view of the lower deck 500 along cut line 508. As depicted, the lower deck 500 includes an active layer 510 and a dummy layer 512. Memory holes 502 are also depicted having the critical dimension (CD) 506 and an inter memory hole spacing 514 of <40 nm (e.g., 150 nm center spacing 504 less widened CD 516). In some examples, memory holes 502 in lower deck 500 can be formed from a direction etch tool, such as, the RAPTOR® tool available from Applied Materials Inc., Santa Clara, CA.

The directional etch tool can form memory hole 502 with directional etch 518 creating shoulders or areas of widened CD (e.g., widened CD 516 versus critical dimension (CD) 506) in memory hole 502. This is more clearly illustrated in FIG. 6A, which shows shoulder regions 630 removed from lower memory hole 608 of lower deck 602 forming areas in lower memory hole 608 where the CD is wider. Said differently, an upper portion of lower memory hole 608 has a wider CD than a lower portion of lower memory hole 608. In some implementations, the critical dimension (CD) 506 may be between 50 and 120 nanometers (nm), while the widened CD 516 may be greater than or equal to the critical dimension (CD) 506 plus 5 nm, or between 5 and 30 nm greater than the critical dimension (CD) 506.

It is important to note that the upper portion with the wider CD may be in the dummy layer 606 while the lower portion with the original CD may be in the active layer 604. As such, the areas of lower memory hole 608 with increased CD may be in the regions of lower deck 602 that are not electrically active (e.g., dummy layer 606, or the like) and as such may not result in loss of electrical performance of 3D NAND device 600.

Continuing to block 408 "fill the memory holes with dummy fill" the memory holes can be filled with dummy fill. The lower memory holes 608 can be filled with dummy fill. For example, FIG. 6B depicts lower memory hole 608 filled with a dummy fill 616, such as aluminum oxide (AiO), or the like. Lower memory holes 608 filled with dummy fill 616 are often processed with a CMP process to prepare the top surface of the lower deck 602 for formation of an upper deck thereon.

Continuing to block 410 "deposit alternating layers of silicon oxide and silicon nitride on the lower deck to form an upper deck" alternating layers of silicon material can be deposited on the lower deck 602 to form an upper deck 618. For example, FIG. 6C depicts the processed lower deck 602 with an upper deck 618 formed thereon (e.g., via PEVCD). Upper deck 618 includes alternating layers of silicon nitride 612 and silicon oxide 614, like lower deck 602.

Continuing to block 412 "etch memory holes in the upper deck with a stop at the dummy fill" memory holes are etched in the upper deck 618 with a stop at the dummy fill 616. For example, upper memory holes 620 are etched in upper deck 618 with a stop at dummy fill 616. As depicted in FIG. 6C, upper memory hole 620 are formed in upper deck 618 and even where errors in the process (e.g., tilt error, or the like) are present (e.g., the right upper memory hole 620) the sidewalls 610 are not adversely affected.

Continuing to block 414 "remove the dummy fill" the dummy fill 616 can be removed. For example, FIG. 6D shows lower deck 602 and upper deck 618 after formation of the lower memory holes 608 and upper memory hole 620 and after removal of dummy fill 616. As depicted in this figure, upper memory holes 620 are formed in upper deck 618 atop lower deck 602 which has lower memory holes 608 disposed below the upper memory holes 620. Furthermore, lower memory hole 608 have shoulder regions 630, or rather upper regions of widened CD, providing a buffer against misalignments resulting from processing errors in forming upper memory holes 620. As such, despite a tilt in the etch process of forming the right upper memory hole 620, sidewalls 610 remain at a sufficient margin.

Continuing to block 416 "fill the memory holes with memory cell material" the memory holes are filled with memory cell fill material 622. For example, once the lower deck 602 and upper deck 618 including lower memory holes 608 and upper memory holes 620 are formed and the dummy fill 616 removed, the lower memory holes 608 and upper memory holes 620 are filled with memory cell fill material 622, as depicted in FIG. 6E. Filling the lower memory holes 608 and upper memory holes point of failure 326 with memory cell fill material 622 may be accompanied by another CMP process.

Continuing to block 418 "form horizontal word lines in the silicon nitride layers" metal layers can be formed in the sidewalls 610. As depicted in FIG. 6F, WL metal 628 is formed in sidewalls 610 in place of silicon nitride 612, to form 3D NAND device 600. As shown, 3D NAND device 600 is immune to the points of failure depicted in 3D NAND device 300 resulting from process errors in forming upper memory hole 320. Sidewalls 610 in region 624 have a sufficient width to prevent defects. Likewise, the region 626 of sidewalls 610 (e.g., between upper portions of lower memory holes 608 having a widened CD) also has a sufficient width to prevent defects resulting from errors in forming upper memory holes 620. The number of WL metal 628 can be used to form NAND logic circuitry for a 3D non-volatile storage device, such as a 3D NAND device or a 3D NAND memory device.

FIG. 7 illustrates a semiconductor manufacturing system 700 comprising a controller 702 and semiconductor process tool(s) 704. Controller 702 is communicatively (e.g., electrically or wirelessly) coupled to semiconductor process tool(s) 704 and arranged to receive signals from semiconductor process tool(s) 704 and to communicate control signals to semiconductor process tool(s) 704. One example of semiconductor process tool(s) 704 is RAPTOR®, available from Applied Materials Inc., Santa Clara, CA.

In general, semiconductor process tool(s) 704 operates on target 716 (e.g., to form lower memory holes 608 in lower deck 602, or the like). Semiconductor process tool(s) 704 may further include various components (not shown) to support manufacturing of semiconductor devices such as 3D NAND device 600, or the like. Additionally, semiconductor process tool(s) 704 can be multiple tools not housing in a single housing (despite a single tool being depicted in this FIG. 7.

In some embodiments, semiconductor process tool(s) 704 can be controlled by a computing device, such as, controller 702. Controller 702 can be any of a variety of computing devices, such as, a workstation, a laptop, a server, or the like. In some embodiments, controller 702 and Semiconductor process tool(s) 704 are integrated into the same enclosure or housing. In other embodiments, controller 702 and Semiconductor process tool(s) 704 are separate devices. In general, controller 702 is arranged to control the process of manufacturing a semiconductor device, such as, formation of the lower memory hole 608 including areas of increased CD, such as shoulder regions 630 described herein. The controller 702 may include processor 706, memory 708, control circuitry 710, and input/output devices 718. Processor 706 can be electrically coupled to memory 708 and arranged to execute computer-executable instructions, such as, instructions 712 to facilitate processing target 716 and particularly implanting protons into target 716.

Controller 702 can also include control circuitry 710, such as hardware for monitoring proton implant processing via sensors (not shown) in Semiconductor process tool(s) 704. To facilitate control of the Semiconductor process tool(s) 704 described above, processor 706 may be one of any form of general-purpose computer processor that can be used in an industrial setting, such as a programmable logic controller (PLC), for controlling various chambers and sub-processors, a field-programmable gate-array (FPGA), an application integrated circuit (ASIC), a commercial central processing unit (CPU) having one or more processing cores. Memory 708 can be non-transitory memory and may be one or more of readily available memory such as random-access memory (RAM), read only memory (ROM), floppy disk drive, hard disk, solid-state drive, flash memory, or the like. Memory 708 can store instructions 712, which are executable by memory 708 as well as proton implant process parameters 714, which can include information such as the energy and dose for each iteration of a multi-iteration proton implant process as described herein.

The instructions 712 stored in memory 708 are in the form of a program product or a computer-readable storage medium, that can cause circuitry (e.g., processor 706) to implement the methods of the present disclosure when executed. FIG. 8 illustrates computer-readable storage medium 800. Computer-readable storage medium 800 may comprise any non-transitory computer-readable storage medium or machine-readable storage medium, such as an optical, magnetic or semiconductor storage medium. In various embodiments, computer-readable storage medium 800 may comprise an article of manufacture. In some embodiments, computer-readable storage medium 800 may store computer executable instructions 802 with which circuitry (e.g., memory 708, control circuitry 710, or the like) can execute. For example, computer executable instructions 802 can include instructions to implement operations described with respect to method 400 and/or instructions 712. Examples of computer-readable storage medium 800 or machine-readable storage medium may include any tangible media capable of storing electronic data, including volatile memory or non-volatile memory, removable or non-removable memory, erasable or non-erasable memory, writable or re-writable memory, and so forth. Examples of computer executable instructions 802 may include any suitable type of code, such as source code, compiled code, interpreted code, executable code, static code, dynamic code, object-oriented code, visual code, and the like.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the 3D NAND device 600, etc. (e.g., as described herein). Data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high-density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method of fabricating a three-dimensional (3D) non-volatile storage device, comprising:
    etching a plurality of lower deck memory holes in a lower deck by delivering ions into an upper portion of a sidewall of each lower deck memory hole of the plurality of lower deck memory holes without delivering the ions into a lower portion of the sidewall of each lower deck memory hole of the plurality of memory holes, wherein the ions are delivered at a non-zero angle relative to a perpendicular extending from a plane defined by an upper surface of the lower deck, and wherein the upper portion of the plurality of memory holes has a critical dimension greater than a critical dimension of the lower portion of the plurality of lower deck memory holes; and
    filling the plurality of lower deck memory holes with a dummy fill.

2. The method of claim 1, comprising depositing material to form a first plurality of horizontal layers above a semiconductor substrate to form the lower deck.

3. The method of claim 2, comprising:
    depositing the material to form a second plurality of horizontal layers above the lower deck to form an upper deck; and
    etching a plurality of upper deck memory holes in the upper deck.

4. The method of claim 3, comprising:
    removing the dummy fill;
    filling the plurality of upper deck memory holes and the plurality of lower deck memory holes with memory cell fill material; and
    forming a plurality of metal layers in the material to form horizontal word lines.

5. The method of claim 4, etching the upper portion of the sidewall the plurality of lower deck memory holes in the lower deck comprising directionally etching away material from shoulders of the upper portion of the plurality of lower deck memory holes.

6. The method of claim 4, wherein the critical dimension of the lower portion of the plurality of lower deck memory holes comprises between 50 and 140 nanometers.

7. The method of claim 4, wherein the critical dimension of the upper portion of the plurality of lower deck memory holes is greater than or equal to the critical dimension of the lower portion of the plurality of lower deck memory holes plus 5 nanometers.

8. The method of claim 4, wherein the material comprises silicon oxide and silicon nitride.

9. The method of claim 4, wherein the plurality of horizontal layers are alternating layers of silicon oxide and silicon nitride.

10. The method of claim 4, wherein the 3D non-volatile storage device comprises a 3D NAND logic circuitry.

* * * * *